United States Patent
Chen et al.

(10) Patent No.: US 9,058,899 B2
(45) Date of Patent: Jun. 16, 2015

(54) DATA-AWARE SRAM SYSTEMS AND METHODS FORMING SAME

(71) Applicant: Taiwan Semiconductor Manufacturing Company, Ltd., Hsin-Chu (TW)

(72) Inventors: Chien-Yuan Chen, Hsin-Chu (TW); Yi-Tzu Chen, Hsin-Chu (TW); Hau-Tai Shieh, Hsin-Chu (TW); Tsung-Yung Jonathan Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 14/083,249

(22) Filed: Nov. 18, 2013

(65) Prior Publication Data

US 2014/0119104 A1 May 1, 2014

Related U.S. Application Data

(62) Division of application No. 13/168,581, filed on Jun. 24, 2011, now Pat. No. 8,587,992.

(51) Int. Cl.
*G11C 11/00* (2006.01)
*G11C 11/417* (2006.01)
*G11C 11/412* (2006.01)
*G11C 11/413* (2006.01)

(52) U.S. Cl.
CPC ............ *G11C 11/417* (2013.01); *G11C 11/412* (2013.01); *G11C 11/413* (2013.01)

(58) Field of Classification Search
CPC ......... G11C 7/22; G11C 11/419; G11C 5/147
USPC .................................................. 365/156, 188
See application file for complete search history.

(56) References Cited

U.S. PATENT DOCUMENTS

| | | | |
|---|---|---|---|
| 5,796,650 A * | 8/1998 | Wik et al. | 365/150 |
| 6,707,693 B1 * | 3/2004 | Ichiriu | 365/49.17 |
| 7,292,492 B2 | 11/2007 | Matsui | |
| 8,699,291 B1 * | 4/2014 | Ch'ng et al. | 365/226 |
| 2005/0047218 A1 * | 3/2005 | Kirihata et al. | 365/189.07 |
| 2009/0207642 A1 * | 8/2009 | Shimano et al. | 365/72 |
| 2012/0069636 A1 * | 3/2012 | Pelley et al. | 365/154 |
| 2013/0107651 A1 * | 5/2013 | Singh | 365/207 |

OTHER PUBLICATIONS

Zhang, K., et al., "A 3-GHz 70Mb SRAM in 65nm CMOS Technology with Integrated Column-Based Dynamic Power Supply," IEEE International Solid-State Circuits Conference, Session 26, Non-Volatile Memory, 2005, 3 pages.

\* cited by examiner

*Primary Examiner* — Tuan T Nguyen
(74) *Attorney, Agent, or Firm* — Slater & Matsil, L.L.P.

(57) ABSTRACT

Exemplary embodiments for SRAM cells, new control units for SRAM systems, and embodiments of SRAM systems are described herein. An SRAM cell is configured to receive a first input voltage signal and a second input voltage signal with a different value from the first input voltage signal, and to maintain a first stored value signal and a second stored value signal. A control circuit is configured to receive a first input voltage signal and a second input voltage signal, and controlled by a sleep signal, a selection signal, and a data input signal, so that the output of the control circuit is data sensitive to the data input signal. An SRAM system comprises a plurality of SRAM cells, controlled the disclosed control circuit wherein an SRAM cell has two input voltage signals controlled by a data input signal and its complement signal respectively.

15 Claims, 10 Drawing Sheets

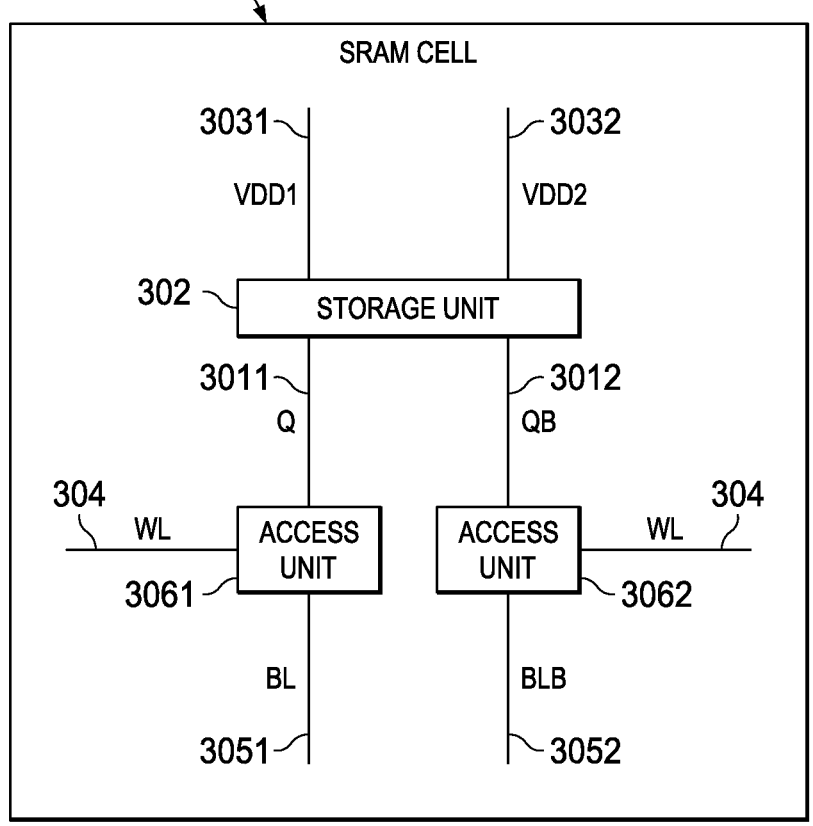

FIG. 9(A)
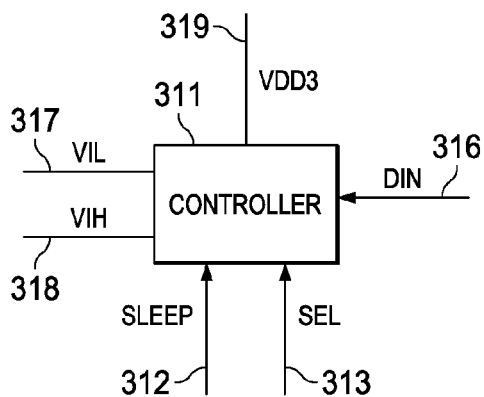
FIG. 9(D)
| MODE | CONTROL INPUTS | VDD3 |
|---|---|---|
| SLEEP | SLEEP = 1 | VIL |
| READ | SLEEP = 0  SEL = 0 | VIH |
| WRITE | SLEEP = 0  SEL = 1  DIN = 0 | VIH |
| WRITE | SLEEP = 0  SEL = 1  DIN = 1 | VIL |
FIG. 9(B)
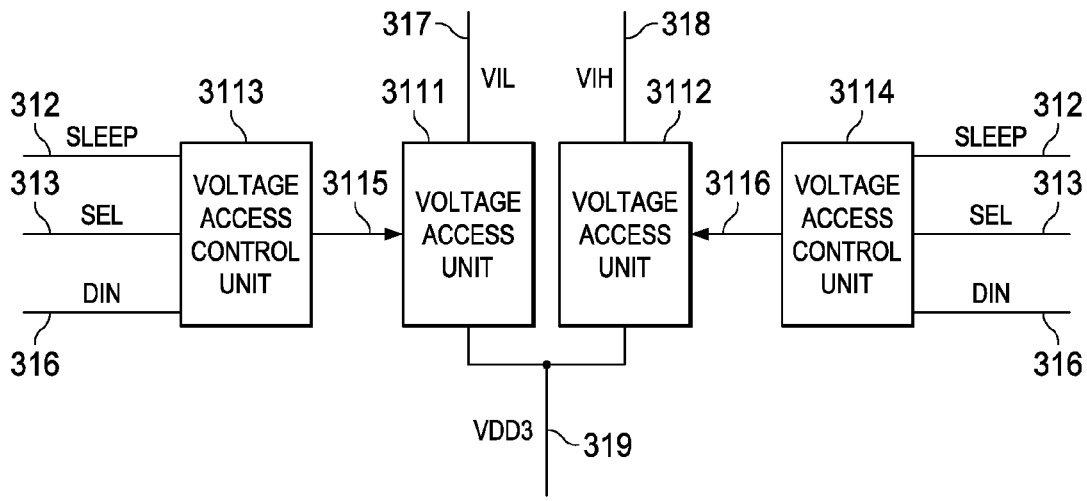
FIG. 9(C)
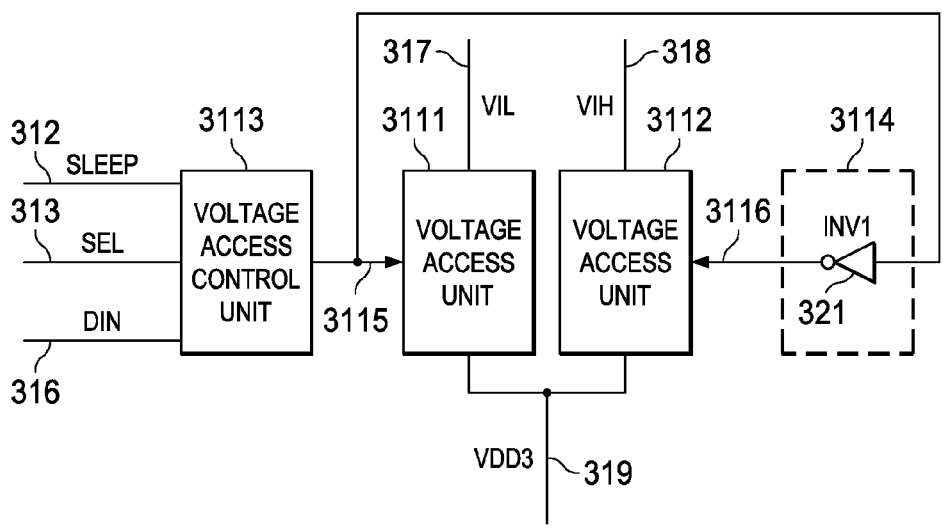

| MODE | CONTROL INPUTS | N1 | P1 | 3115 | 3116 | P2 | P3 | VDD3 |
|---|---|---|---|---|---|---|---|---|
| SLEEP | SLEEP = 1 | ON | OFF | 0 | 1 | ON | OFF | VIL |
| READ | SLEEP = 0  SEL = 0 | OFF | ON | 1 | 0 | OFF | ON | VIH |
| WRITE | SLEEP = 0  SEL = 1  DIN = 0 | OFF | ON | 1 | 0 | OFF | ON | VIH |
| WRITE | SLEEP = 0  SEL = 1  DIN = 1 | OFF | ON | 0 | 1 | ON | OFF | VIL |

| MODE | CONTROL INPUTS | VDD1 3031 | VDD2 3032 |
|---|---|---|---|
| SLEEP | SLEEP = 1 | VIL | VIL |
| READ | SLEEP = 0  SEL = 0 | VIH | VIH |
| WRITE | SLEEP = 0  SEL = 1  DIN = 0 | VIH | VIL |
| WRITE | SLEEP = 0  SEL = 1  DIN = 1 | VIL | VIH |

DATA-AWARE SRAM SYSTEMS AND METHODS FORMING SAME

CROSS-REFERENCE TO RELATED APPLICATIONS

This application is a divisional of U.S. patent application Ser. No. 13/168,581, filed Jun. 24, 2011, which is incorporated herein by reference in its entirety.

BACKGROUND

Generally, memory refers to the physical devices used to store data or programs (sequences of instructions) on a temporary or permanent basis for use in an electronic digital computing device. Computing devices represent information in binary code, written as sequences of 0s and 1s. Each binary digit (or "bit") may be stored by any physical system that can be in either of two stable states, to represent 0 and 1. This could be an on-off switch, an electrical capacitor that can store or lose a charge, a magnet with its polarity up or down, or a surface that can have a pit or not. Today, capacitors and transistors, functioning as tiny electrical switches, are used for temporary storage, and either disks or tape with a magnetic coating, or plastic discs with patterns of pits are used for long-term storage. Primary computing memory makes use of integrated circuits consisting of silicon-based transistors. There are two main types of memory: volatile and non-volatile.

Volatile memory is a kind of computing memory that requires power to maintain the stored information. Most modern semiconductor volatile memory is either Static Random Access Memory (SRAM) or dynamic Random Access Memory (DRAM). SRAM retains its contents as long as the power is connected. SRAM is commonplace in small embedded systems, and it is used in many other systems too. A typical SRAM uses six transistors (6T) to store each memory bit. In addition to such 6T SRAM, other kinds of SRAM chips use 4 transistors (4T), 8 transistors (8T), or more transistors per bit.

As shown in FIG. 1, each bit in an SRAM is stored on a storage cell comprising four transistors P1 and N1, P2 and N2 that form two cross-coupled inverters, where both P-transistors P1 and P2 are connected to a power supply 103Vdd and both N-transistors N1 and N2 are connected to the ground signal 191. This storage cell has two stable states which are used to denote 0 and 1, which is the value at the point 1011 Q and 1012 QB respectively. Two additional transistors N3 and N4 serve to control the access to the signals 1011 Q and 1012 QB, which are controlled by a Word Line (104 WL). The controls for N3 and N4 determine whether the signals 1011Q and 1012 QB should be connected to the bit lines: BL (1051 BL) and BLB (1052 BLB), which are used to transfer data in and out of the SRAM cell. Although it is not strictly necessary to have two bit lines, both the signal and its inverse are typically provided in order to improve noise margins.

An SRAM cell has three different states it can be in: sleep where the circuit is idle, reading when the data has been requested and writing when updating the contents. An SRAM performs the three different states (standby, read, write) as follows:

Sleep—If the word line 104 WL is not asserted, the transistors N3 and N4 disconnect the cell from the bit lines 1051 and 1052. The two cross coupled inverters formed by P1 and N1, P2 and N2 will continue to reinforce each other as long as they are connected to the power supply 103Vdd.

Reading—Assume that the content of the memory is a 1, stored at 1011 Q. The read cycle is started by pre-charging both the bit lines 1051BL and 1052 BLB to a logical 1, then asserting the word line 104 WL, enabling both the access transistors N3 and N4. The second step occurs when the values stored in 1011 Q and 1012 QB are transferred to the bit lines by leaving 1051 BL at its pre-charged value and discharging 1052 BLB through N2 and N4 to a logical 0 (i.e., eventually discharging through the transistor N2 as it is turned on because the 1011Q is logically set to 1). On the 1051 BL side, the transistors P1 and N3 pull the bit line 1051 BL toward $V_{DD}$, a logical 1 (i.e., eventually being charged by the transistor P1 as it is turned on because 1012 QB is logically set to 0). If the content of the memory was a 0, the opposite would happen and 1051 BL would be pulled toward 0 and 1052 BLB toward 1. In either event, 1051 BL and 1052 BLB will have a voltage small difference of delta between them. A sense amplifier (not shown) will sense which line has higher voltage and thus will tell whether there was 1 stored or 0. The higher the sensitivity of sense amplifier, the faster the speed of the read operation is.

Writing—The start of a write cycle begins by applying the value to be written to the bit lines 1051 BL and 1052 BLB. If we wish to write a 0, we would apply a 0 to the bit lines, i.e. setting 1051 BL to 0 and 1052 BLB to 1. This is similar to applying a reset pulse to a SR-latch, which causes the flip flop to change state. A 1 is written by inverting the values of the bit lines 1051 BL and 1052 BLB. The line 104 WL is then asserted and the value that is to be stored is latched in. Note that the reason this works is that the bit line input-drivers are designed to be much stronger than the relatively weak transistors P1, N1, P2, and N2 in the cell itself, so that they can easily override the previous state of the cross-coupled inverters.

Multiple SRAM cells can be arranged to form an SRAM array. As shown in FIG. 2, the size of an SRAM with m address lines and n data lines is $2^m$ words, or $2^m \times n$ bits. FIG. 2 gives an overview of an SRAM memory design for a single data bit input/output. A single address of n+m bits is split into m row addresses 109 and n column address 110. The row address is first decoded by the 107 row decoder, so that one out of $2^m$ word lines 104 WL in the memory array is being selected. Most RAMs are built so that all cells in the same row are activated. Consequentially, all $2^n$ bit line pairs forming the columns leaving the memory array now contain data. The column decoder 108 selects one of these line pairs based on the column address 110, as shown in FIG. 2 as the 100 SRAM cell being selected. The selected cell 100 has a structure shown in FIG. 1. The power supply of the SRAM cell 100 is connected to the same word line 104, therefore the power supply of the SRAM cell operates at the same voltage as the word line WL 104. Typically, the signals from the selected 100 SRAM cell are output of the signals 1011 Q and 1012 QB, as demonstrated in FIG. 1. The output signals from 1011 Q and 1012QB are passed to 1051BL and 1052 BLB respectively and are sense-amplified, and then put into the data read buffer (not shown). In addition, the control signals Read (112 R), Write (113 W), and Sleep (114S) pass through a controller to decide which operations to perform based on the values of 112R, 113W, and 114S. Finally signal 115 is the data out read from the signal 1011Q for a Read operation and signal 116 is the data in which is write to the signal 1011Q for a Write operation.

BRIEF DESCRIPTION OF THE DRAWINGS

For a more complete understanding of the present invention, and the advantages thereof, reference is now made to the following descriptions taken in conjunction with the accompanying drawing, in which:

FIG. 3 is a schematic view of an illustrative embodiment of an SRAM memory cell comprising two different input voltages 3031 Vdd1 and 3032 Vdd2;

FIGS. 9(A)-9(C) are schematic views of illustrative embodiments of a controller for an SRAM memory system with various control input signals and input voltage signals, together with its operation shown in Table FIG. 9(D);

Figure 1:
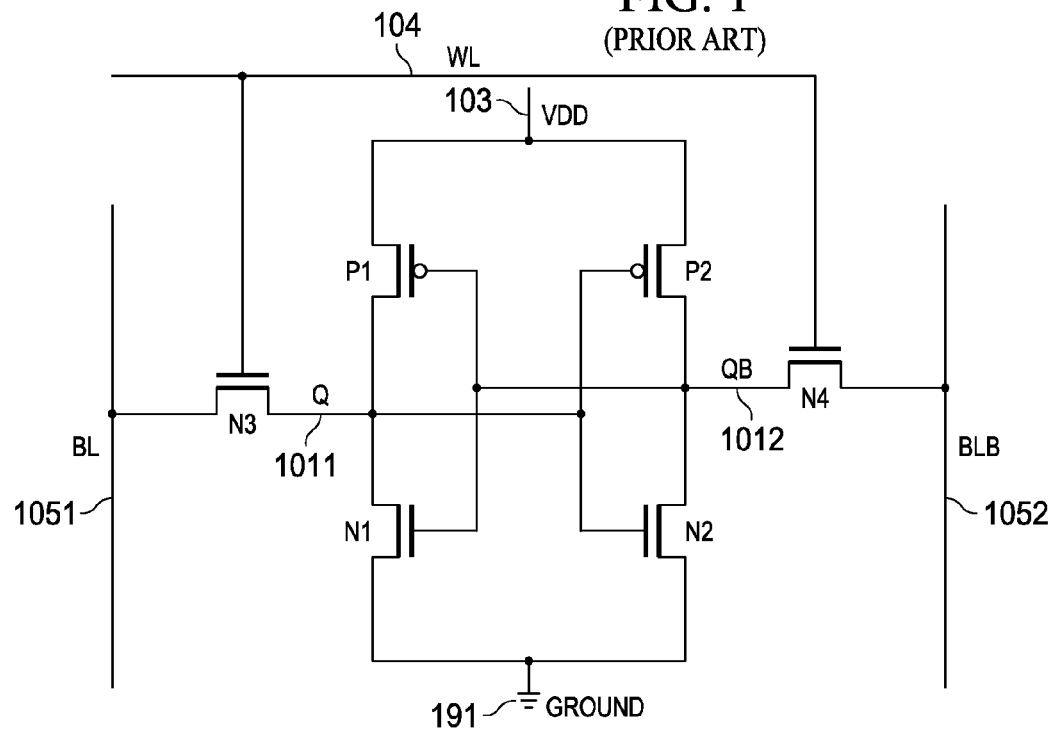
FIG. 1 is a schematic view of a conventional 6 transistor (6T) SRAM cell with a word line, two bit lines, and a power supply Vdd.
Figure 2:
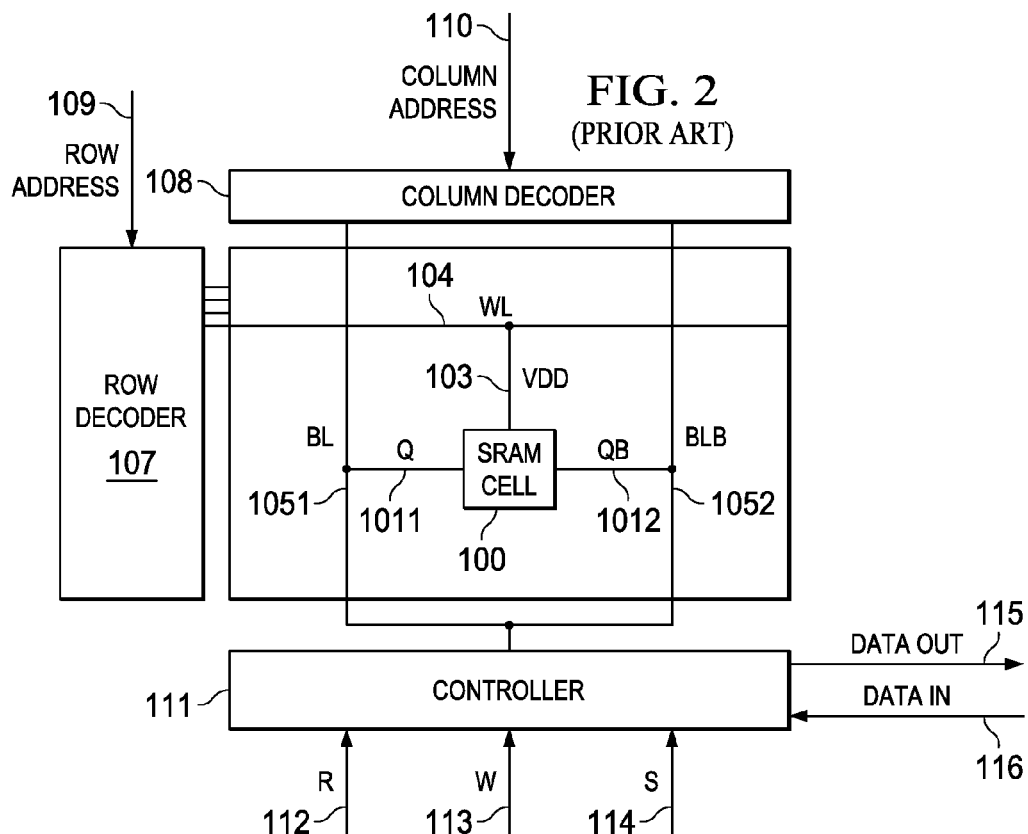
FIG. 2 is a schematic view of a conventional SRAM system comprising an array of SRAM memory cells, a row decoder, a column decoder, and a controller with control signals Read, Write, and Sleep.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and forming of the present embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely SRAM cells, new control units for an SRAM systems, and embodiments of SRAM systems. Illustrative embodiments will be discussed with respect to an SRAM system design, which are implemented using nMOS transistors, pMOS transistors, invertors, and other basic logic circuits. Those of skill in the art will readily recognize that there are many variations which implement equivalent functions and the illustrative embodiments are made for illustrative purpose only.

FIG. 3 is a schematic view of an illustrative embodiment of an SRAM memory cell. In FIG. 3, a SRAM cell 300 comprises a storage unit 302 configured to receive a first input voltage signal 3031 Vdd1 and a second input voltage signal 3032 Vdd2. As used throughout this description, the term signal could mean the information bearing voltage/current and/or the physical line carrying the information, depending on the context. The two input voltage signals have different values. For example, the first input voltage signal has a value equal to 80% of the value of the second input voltage signal. The storage unit 302 maintains a first stored value signal 3011Q and a second stored value signal 3012QB. When the first stored value signal 3011Q is of value 0, the second stored value signal 3012QB has an equal value to the second input voltage signal 3032Vdd2. Similarly, when the second stored value signal 3012QB is of value 0 the first stored value signal 3011Q has an equal value of the first input voltage signal 3031Vdd1.

The illustrative SRAM cell embodiment 300 further comprises a first access unit 3061 connected to the first stored value signal 3011Q of the storage unit and controlled by a word line signal 304 WL. The first access unit 3061 is configured to read the first stored value signal 3011Q to a first bit line signal 3051BL when the memory cell 300 is in Read operation. The first access unit 3061 is configured to write the value of the first bit line signal 3051BL to the first stored value signal 3011Q when the memory cell is in Write operation. The control signals for the memory to Read or Write are not shown in FIG. 3. When the memory cell 300 is used within a memory SRAM array, the 304WL would be the word line to select the memory cell, and the 3051BL would be the bit line to read data from or write data to the memory cell.

The illustrative SRAM cell embodiment 300 further comprises a second access unit 3062 connected to the second stored value signal 3012QB of the storage unit 302 and controlled by the same word line signal 304 WL as for the first access unit. The second access unit 3062 is configured to read the second stored value signal 3012QB to a second bit line signal 3052BLB when the memory cell is in Read operation. The second access unit 3062 is configured to write the value of the second bit line signal 3052BLB to the second stored value signal 3012QB when the memory cell is in Write operation. The control signals for the memory to Read or Write are not shown in FIG. 3. Within a memory SRAM array, the 304WL would be the word line to select the memory cell, and the 3052BLB would be the bit line to read data from or write data to the memory cell.

The illustrative SRAM cell embodiment 300 may be implemented by various circuit techniques and technologies. Some additional details of illustrative implementations will be shown below. Those implementations are only for illustrative purpose and are not limiting.

Figure 4A:
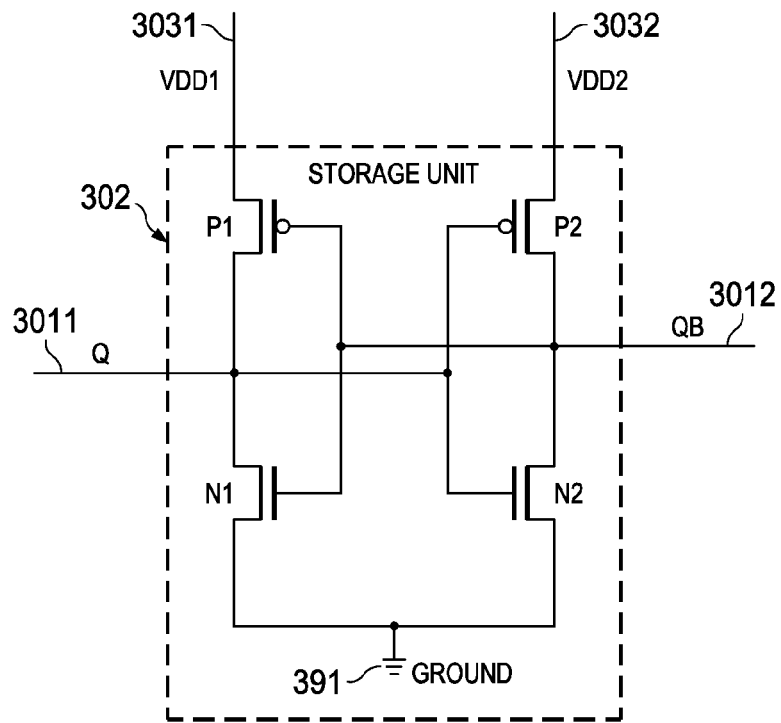
FIGS. 4(A)-4(B) are schematic views of an illustrative embodiment of a storage unit for an SRAM memory cell.
Figure 4B:
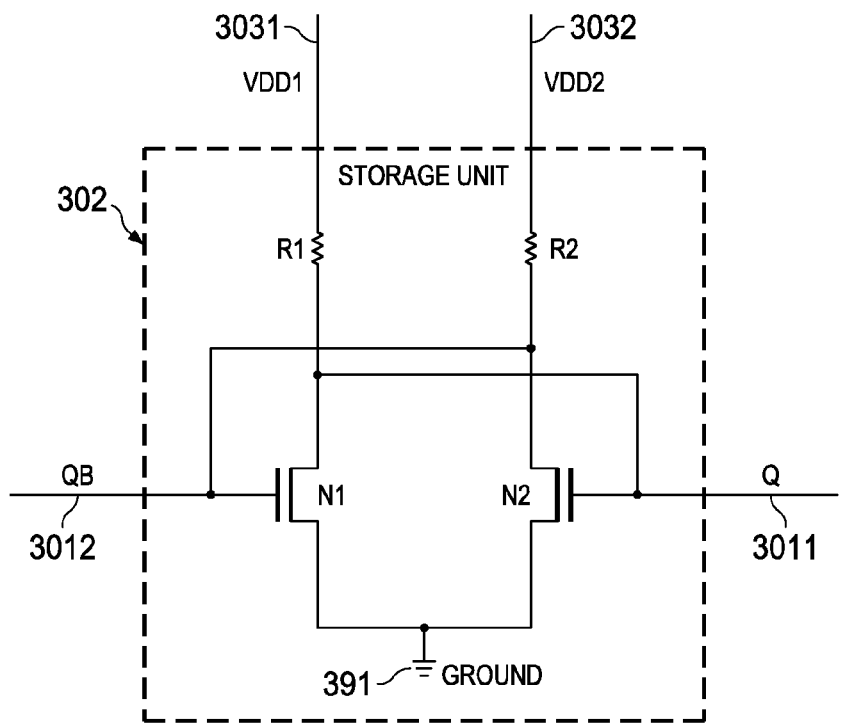

FIGS. 4(A)-4(B) are schematic views of an illustrative embodiment of a storage unit 302 for an SRAM memory cell 300 shown in FIG. 3. An illustrative embodiment of a storage unit 302 shown in FIG. 4(A) comprises: a first P-transistor P1 has its first terminal connected to the first input voltage signal 3031Vdd1; and a second P-transistor P2 has its first terminal connected to the second input voltage signal 3032Vdd2. Furthermore, a second terminal of the second P-transistor P2 is connected to a gate of the first P-transistor P1, a second terminal of the first P-transistor P1 is connected to a gate of the second P-transistor P2. The illustrative embodiment of a storage unit 302 further comprises a first N-transistor N1 wherein a first terminal of the first N-transistor N1 is connected to the second terminal of the first P-transistor P1, a gate of the first N-transistor N1 is connected to the gate of the first P-transistor P1, and a second terminal of the first N-transistor N1 is connected to a ground signal. The illustrative embodiment of a storage unit 302 further comprises a second N-transistor N2 wherein a first terminal of the second N-transistor N2 is connected to the second terminal of the second P-transistor P2, a gate of the second N-transistor N2 is connected to the gate of the second P-transistor P2, and a second terminal of the second N-transistor N2 is connected to the ground signal. The illustrative embodiment of a storage unit 302 has the first stored value signal 3011Q connected to the gate of the second P-transistor P2; and the second stored value signal 3012QB connected to the gate of the first P-transistor P1.

The illustrative embodiment storage unit 302 in FIG. 4(A) maintains the first stored value signal 3011Q and the second stored value signal 3012QB. When the first stored value signal 3011Q is of value 0, the first stored value signal 3011Q turns on the P2 transistor, which leads to the second stored value signal 3012QB having an value equal to the second input voltage signal 3032Vdd2, while both N2 and P1 are off and N1 and P2 are on. Therefore the value of 3011Q, which is 0, and the value of 3012Q, which is equal value as 3032Vdd2, are both stable. Similarly, when the second stored value signal 3012QB is of value 0, the second stored value signal 3011QB turns on the P1 transistor, which leads to the first stored value signal 3011Q having an value equal to the first input voltage signal 3031Vdd1, while both N1 and P2 are off and N2 and P1 are on. Therefore the value of 3012QB, which is 0, and the value of 3011Q, which is equal value as 3031Vdd1, are both stable.

Another illustrative embodiment of a storage unit 302 shown in FIG. 4(B) comprises: a first resistor R1 has a first terminal connected to the first input voltage signal 3031Vdd1; a second resistor R2 has a first terminal connected to the second input voltage signal 3032Vdd2; a first N-transistor N1 has a first terminal connected to a second terminal of R1, a gate of N1 connected to a second terminal of R2, and a second terminal of N1 connected to a ground signal; a second N-transistor N2 has a first terminal connected to a second terminal of the R2, a gate of the N2 connected to a second terminal of R1, and a second terminal of the N2 connected to the ground signal. Furthermore, the illustrative embodiment of a storage unit 302 has the first stored value signal 3011Q connected to the second terminal of R1, and has the second stored value signal 3012QB connected to the second terminal of R2.

The resistor R1 and the transistor N1 divide the voltage between Vdd1 and ground. If N1 is in high impedance state, then the voltage differential falls off almost entirely at N1, so that the connection between R1 and N1 is at Vdd1 voltage. If this is the case, then N2 is enabled and therefore in low impedance state. As a consequence, the voltage level between R2 and N2 is close to ground, leading to the second stored value signal 3012QB which is connected to the second terminal of R2 to have value 0. This in turn disables N1, which remains in high impedance, therefore the value for the first stored value signal 3011Q would be equivalent to 3031Vdd1. If however N1 is in low impedance, then the roles of N1 and N2 are reversed. Therefore there exist two stable states, one with N1 in high impedance and one with N2 in high impedance.

FIGS. 5(A)-5(D) are schematic views of illustrative embodiments of access units 3061 and 3062 for an SRAM memory cell 300 shown in FIG. 3. An illustrative embodiment of an access unit 3061 shown in FIG. 5(A) comprises: a first N-transistor N1 wherein the word line signal 304 WL is connected to a gate of the first N-transistor N1, the first stored value signal 3011Q is connected to a first terminal of N1, and the first bit line signal 3051BL is connected to a second terminal of N1. When the world line signal 304WL is high, the N-transistor is ON, the value of 3051BL is equal to the value of 3011Q. Therefore the 3011Q is read to 3051BL signal or the value of 3051BL is written to the signal 3011Q. The access is controlled by the word line signal 304WL.

Figure 5A:
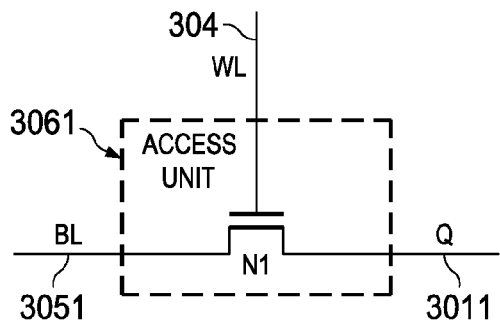
FIGS. 5(A)-5(D) are schematic views of an illustrative embodiment of an access unit for an SRAM memory cell.
Figure 5B:
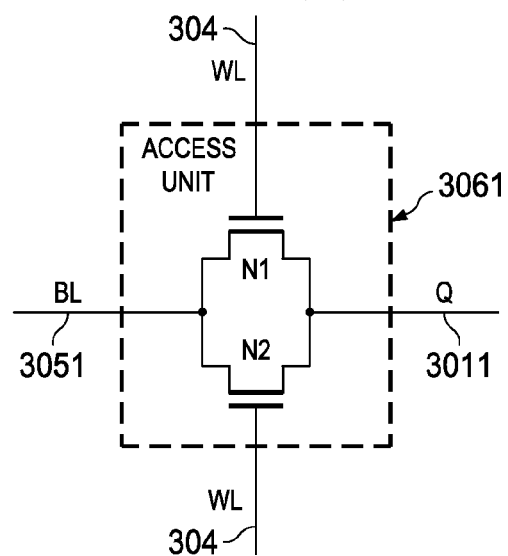
Figure 5C:
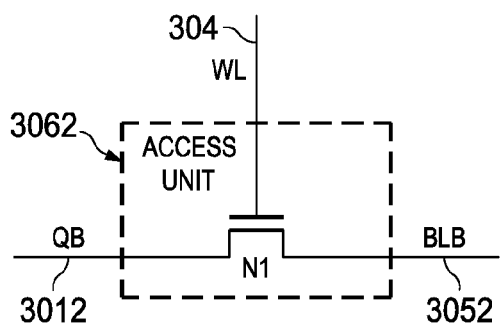

An illustrative embodiment of an access unit 3061 shown in FIG. 5(B) comprises: a first N-transistor N1, wherein the word line signal 304 WL is connected to a gate of the first N-transistor N1, the first stored value signal 3011Q is connected to a first terminal of the first N-transistor N1, and the first bit line signal 3051BL is connected to a second terminal of the first N-transistor N1. the access unit 3061 further comprises a second N-transistor N2 wherein the word line signal 304 WL is connected to a gate of the second N-transistor N2, the first stored value signal 3011Q is connected to a first terminal of the second N-transistor N2, and the first bit line signal 3051BL is connected to a second terminal of the second N-transistor. The access unit in FIG. 5(B) operates in a similar way as the access unit operates in FIG. 5(A).

Either of the access units 3061 shown in FIG. 5(A) and FIG. 5(B) can be used as the second access unit 3062 in FIG. 3. When the access unit in FIG. 5(A) is used for the second access unit 3062, the transistor N1 is still controlled by the word line signal 304WL. On the other hand, the second stored value signal 3012QB is connected to a first terminal of the first N-transistor N1, and the second bit line signal 3052BLB is connected to a second terminal of the first N-transistor N1. Similar connections can be made for the access unit in FIG. 5(B) so that it can become an access unit 3062 as shown in FIG. 5(D).

The above storage units shown in FIG. 4 and access units shown in FIG. 5 are only for illustration purposes. Other forms of implementations exist to perform the desired functions for the storage unit or the access unit. One more illustrative example for the access unit could be implemented by a P-transistor (not shown) rather than the N-transistor shown in FIG. 5. Those of skill in the art will readily recognize that there are many variations which implement equivalent functions and the illustrative embodiments are made for illustrative purpose only.

Figure 6:
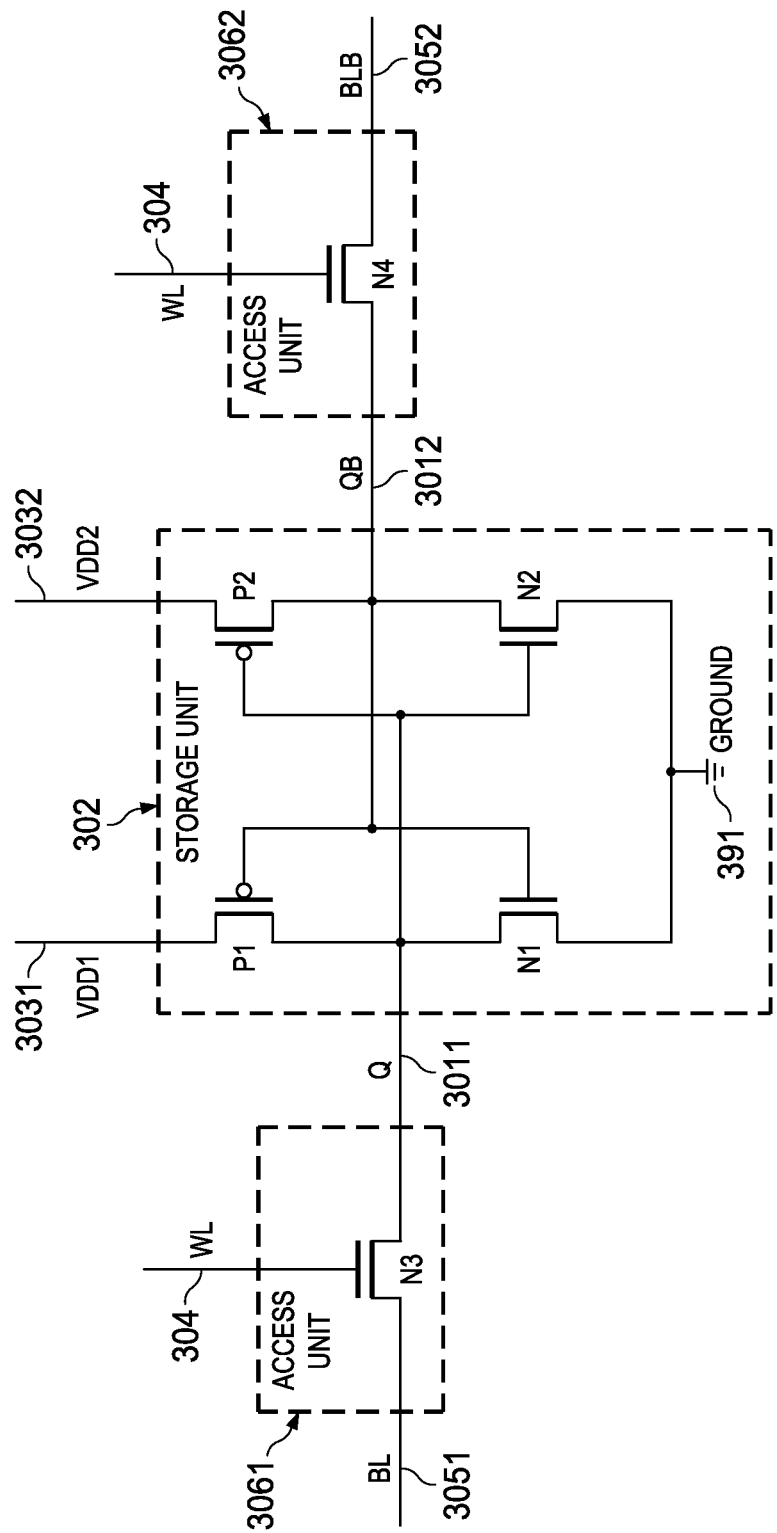
FIGS. 6-8 are schematic views of illustrative embodiments of an SRAM memory cell with various storage units and access units and two different input voltages 3031 Vdd1 and 3032 Vdd2.

Various illustrative storage units 302 and the access units 3061 and 3062 can be assembled to form an SRAM cell 300 shown in FIG. 3. For example, a storage unit 302 shown in FIG. 4(A), together with an access unit 3061 shown in FIG. 5(A), in addition to an access unit 3062 shown in FIG. 5(C), can form an illustrative embodiment of an SRAM cell as shown in FIG. 6. The SRAM cell shown in FIG. 6 is configured to receive a first input voltage signal 3031 Vdd1 and a second input voltage signal 3032 Vdd2. The two input voltage signals have different values. The storage unit 302 maintains a first stored value signal 3011Q and a second stored value signal 3012QB, which are connected to the two access units 3061 and 3062 respectively. The access units 3061 and 3062 are controlled by the word line signal 304WL and connected to the bit line signal 3051BL and 3052BLB respectively.

Figure 5D:
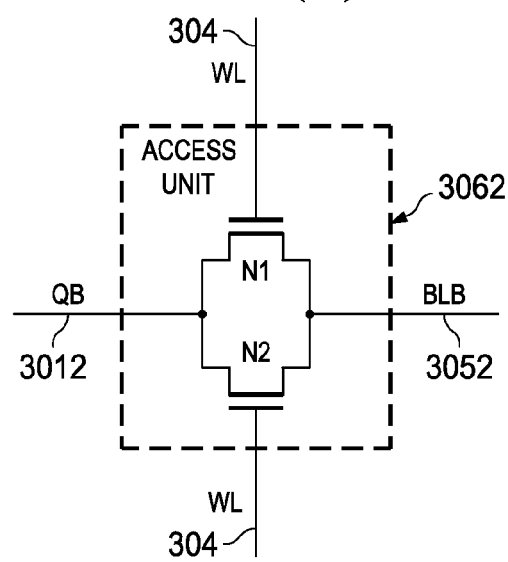
Figure 7:
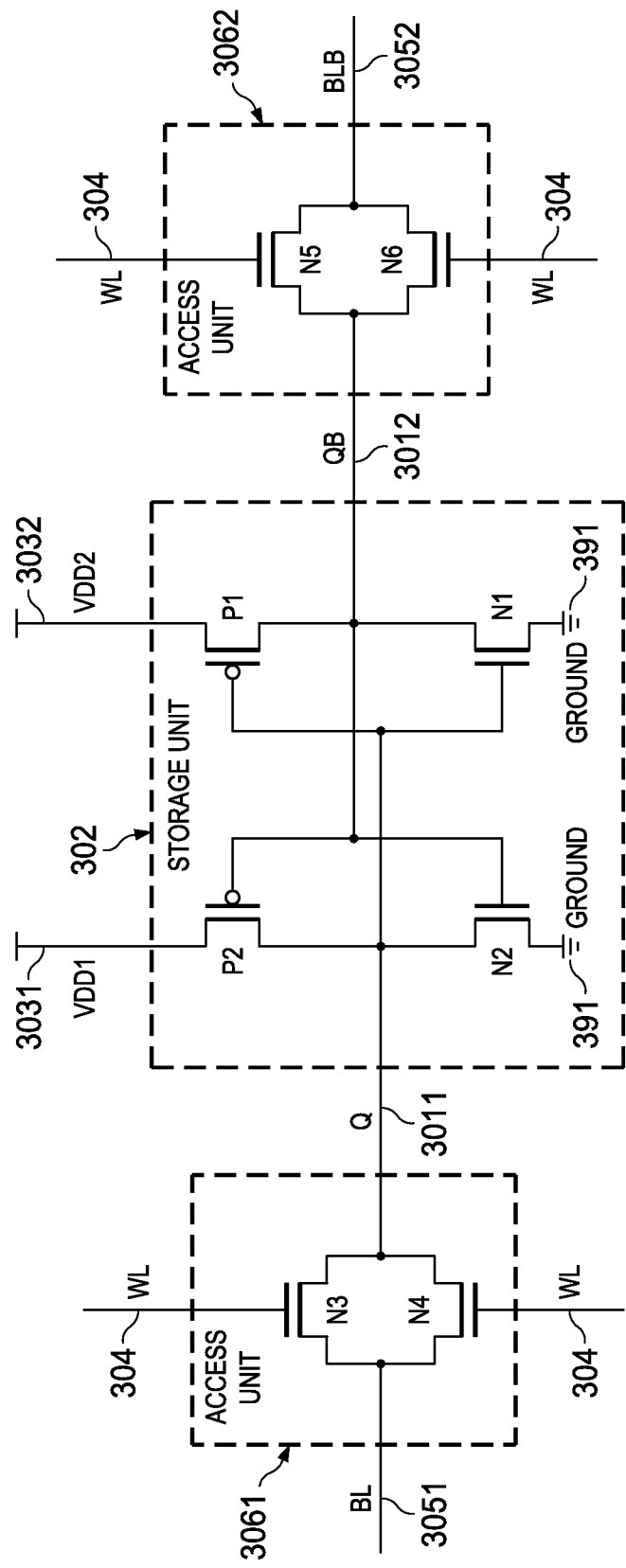
Figure 8:
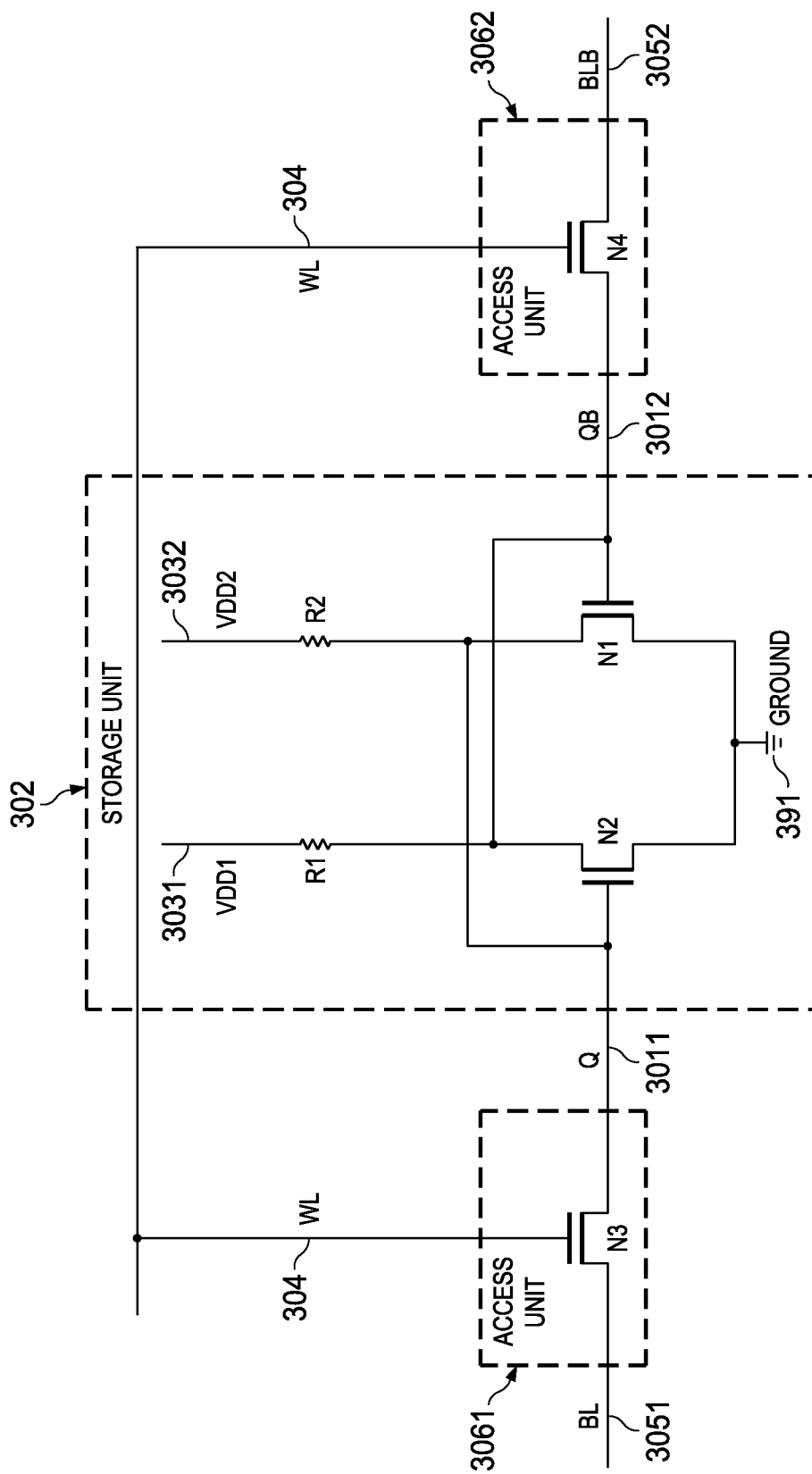

Similarly, a storage unit 302 shown in FIG. 4(A), together with an access unit 3061 shown in FIG. 5(B), in addition to an access unit 3062 shown in FIG. 5(D), can form an illustrative embodiment of an SRAM cell as shown in FIG. 7. A further illustrative embodiment of an SRAM cell can be formed by a storage unit 302 shown in FIG. 4(B), together with an access unit 3061 shown in FIG. 5(A), in addition to an access unit 3062 shown in FIG. 5(C), as shown in FIG. 8. Those of skill in the art will readily recognize that there are many other variations to form an SRAM cell according to the principles shown in FIG. 3.

All these SRAM cells shown in FIG. 7 and FIG. 8 are configured to receive a first input voltage signal 3031 Vdd1 and a second input voltage signal 3032 Vdd2. The two input voltage signals have different values. The storage unit 302 maintains a first stored value signal 3011Q and a second stored value signal 3012QB, which are connected to the two access units 3061 and 3062 respectively. The access units 3061 and 3062 are controlled by the word line signal 304WL and connected to the bit line signal 3051BL and 3052BLB respectively.

Besides a plurality of SRAM cells, an SRAM memory system further comprises a control circuit to control the read, write, or sleep operations. FIGS. 9(A)-9(C) are schematic views of illustrative embodiments of a controller for an SRAM memory system with various control input signals and input voltage signals, together with its operation shown in Table FIG. 9(D).

FIG. 9(A) is an illustrative embodiment of a control circuit 311 for an SRAM memory system. The control circuit 311 is configured to receive a first input voltage signal 317 VIL, a second input voltage signal 318 VIH, and two control signals 312 Sleep and 313 sel. The two input voltage signals 317 VIL and 318 VIH have different values. The control unit 311 is further configured to receive a data input signal 316 DIN, and produce an output voltage signal 319 Vdd3, wherein the value of the output voltage signal 319 Vdds depends on the value of the data input signal 316 DIN, among other control signals. Therefore the circuit 311 is a data-aware control circuit.

For the circuit shown in FIG. 9(A), when the 312 Sleep signal is High, which represents an SRAM memory cell is in Sleep mode, the output voltage signal 319 Vdd3 has a value equal to the first input voltage signal 317 VIL. When the 312 Sleep signal is low and the 313 sel signal is high, which represents an SRAM memory cell is in Write mode, if the data input signal 316 DIN is HIGH, the output voltage signal 319 Vdd3 has a value equal to the first input voltage signal 317 VIL. On the other hand, when the 312 Sleep signal is low and the 313 sel signal is low, which represents an SRAM memory cell is in Read mode, the output voltage signal 319 Vdd3 has a value equal to the second input voltage signal 318 VIH. Finally, when the 312 Sleep signal is low and the 313 sel signal is high, which represents an SRAM memory cell is in Write mode, if the data input signal 316 DIN is LOW, the output voltage signal 319 Vdd3 has a value equal to the second input voltage signal 318 VIH. The details of the above operation are shown in Table FIG. 9(D).

The illustrative embodiment of a control circuit 311 shown in FIG. 9(A) can be implemented in many different ways. An illustrative implementation of a control circuit 311 is shown in FIG. 9(B). The circuit in FIG. 9(B) comprises a first voltage access unit 3111 and a second voltage access unit 3112. A first input voltage signal 317 VIL is connected to the first voltage access unit 3111 and a second input voltage signal 318 VIH is connected to the second voltage access unit 3112. The circuit further comprises a first voltage access control unit 3113 connected to a 312 Sleep signal, a 313 sel signal, and a 316 DIN data input signal, producing a first voltage control output 3115 connected to the first voltage access unit 3111. The circuit further comprises a second voltage access control unit 3114 controlled by the same control signals as for 3113 unit, producing a second voltage control output 3116 connected to the second voltage access unit 3112. An output voltage signal 319 Vdd3 is connected to the first voltage access unit 3111 and the second voltage access unit 3112 as the output voltage signal of the circuit, with a value that is either equal to 317 VIL or 318 VIH, according to the table shown in FIG. 9(D).

An illustrative embodiment of the control circuit shown in FIG. 9(B) can be illustratively implemented as shown in FIG. 9(C), where the first voltage control output 3115 is connected to an inverter 321 to produce the second voltage control output 3116. Therefore the signal 3116 has a complement value of the signal 3115. When the first voltage control output 3115 turns the first voltage access unit 3111 ON, its complement signal 3116 turns the second voltage access unit 3112 OFF, so that the output voltage signal 319 Vdd3 has an equal value to the first input voltage signal 317 VIL. On the other hand, when the first voltage control output 3115 turns the first voltage access unit 3111 OFF, its complement signal 3116 turns the second voltage access unit 3112 ON, so that the output voltage signal 319 Vdd3 has an equal value to the second input voltage signal 318 VIH.

Figures 10A, 10B:
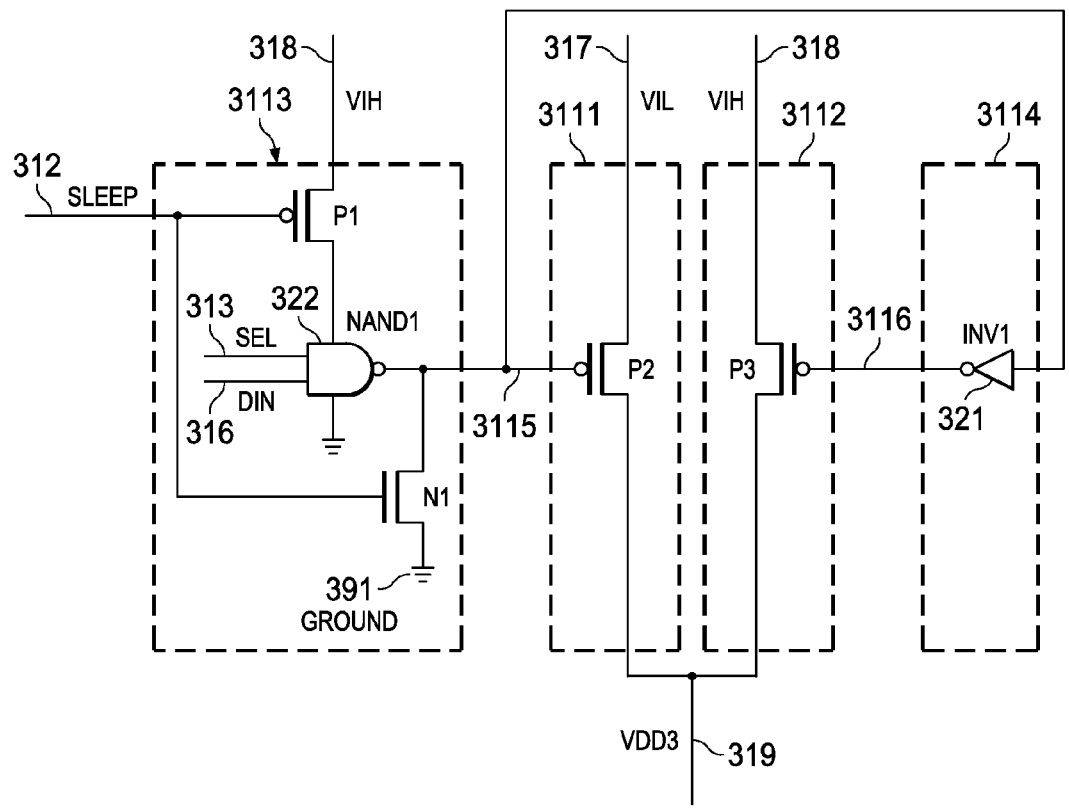
FIG. 10(A) is a schematic view of illustrative embodiment of a controller for an SRAM memory system with pass transistors as access units, together with its operation shown in Table FIG. 10(B)

An illustrative embodiment of the voltage access unit 3111, voltage access unit 3112, and voltage access control unit 3113 in FIG. 9(C) can be implemented in more details as shown in FIG. 10(A). In FIG. 10(A), both the 3111 unit and the 3112 unit comprise a P-transistor P2 and P3 acting as a pass transistor, connected to 317VIL and 318 VIH respectively. When the control signal 3115 is of value 0, the voltage access unit 3111 is ON, and the value of 317 VIL is passed to the output voltage signal 319Vdd3. At the same time, when the control signal 3115 is of value 0, the control signal 3116 would have value 1 and therefore the P-transistor P3 is OFF.

An illustrative embodiment of the voltage access control unit 3113 in FIG. 9(C) can be implemented in more details as shown in FIG. 10(A). The voltage access control unit 3113 comprises a first P-transistor P1, a first N-transistor, and a first NAND gate. A voltage signal is connected to a first terminal of P1, the sleep signal 312 Sleep is connected to a gate of P1, and a second terminal of P1 is connected to a power supply of a first NAND gate 322 Nand1. The sleep signal 312 Sleep is connected to a gate of N1, a ground signal is connected to a first terminal of N1, and the first voltage control output 3115 is connected to a second terminal of N1. The selection signal 313 sel and the data input signal 316 DIN are connected to a first input and a second input of the NAND gate 322 Nand1, and the first voltage control output 3115 is connected to a first output of the NAND gate.

The detailed operations of the controller 311 shown in FIG. 10(A) are summarized in the table shown in FIG. 10(B). When the sleep signal 312 Sleep is ON, which means an SRAM memory cell is in Sleep mode, N1 is ON and 3115 signal is of value 0, which turns P2 ON and P3 OFF by 3116 signal, therefore the output 319 Vdd3 has the same value as the first input voltage signal 317 VIL as shown in FIG. 10(B).

When the sleep signal 312Sleep is 0, and the 313 sel signal is 0, which means an SRAM memory cell is in Read mode, N1 if OFF, and the NAND gate has value 1 because one of the inputs for the NAND gate 313 sel is of value 0. Therefore the signal 3115 is of value 1 and 3116 is of value 0, which turns P2 OFF and P3 ON, hence the output 319 Vdd3 has the same value as the second input voltage signal 318 VIH, as shown in FIG. 10(B).

When the sleep signal 312Sleep is 0, and the 313 sel signal is 1, which means an SRAM memory cell is in Write mode, N1 if OFF. The output of the NAND gate depends on the data input value 316 DIN. If 316 DIN has value 0, the output of the NAND gate is 1. Therefore the signal 3115 is of value 1 and 3116 is of value 0, which turns P2 OFF and P3 ON, hence the output 319 Vdd3 has the same value as the second input voltage signal 318 VIH, as shown in FIG. 10(B).

On the other hand, the sleep signal 312Sleep is 0, and the 313 sel signal is 1, which means an SRAM memory cell is in Write mode, N1 if OFF. If the data input signal 316 DIN has value 1, then the NAND gate has value 0 because both of the inputs for the NAND gate 313 are of value 1. Therefore the signal 3115 is of value 0 and 3116 is of value 1, which turns P2 ON and P3 OFF, hence the output 319 Vdd3 has the same value as the first input voltage signal 317 VIL, as shown in FIG. 10(B).

Figures 11A, 11B:
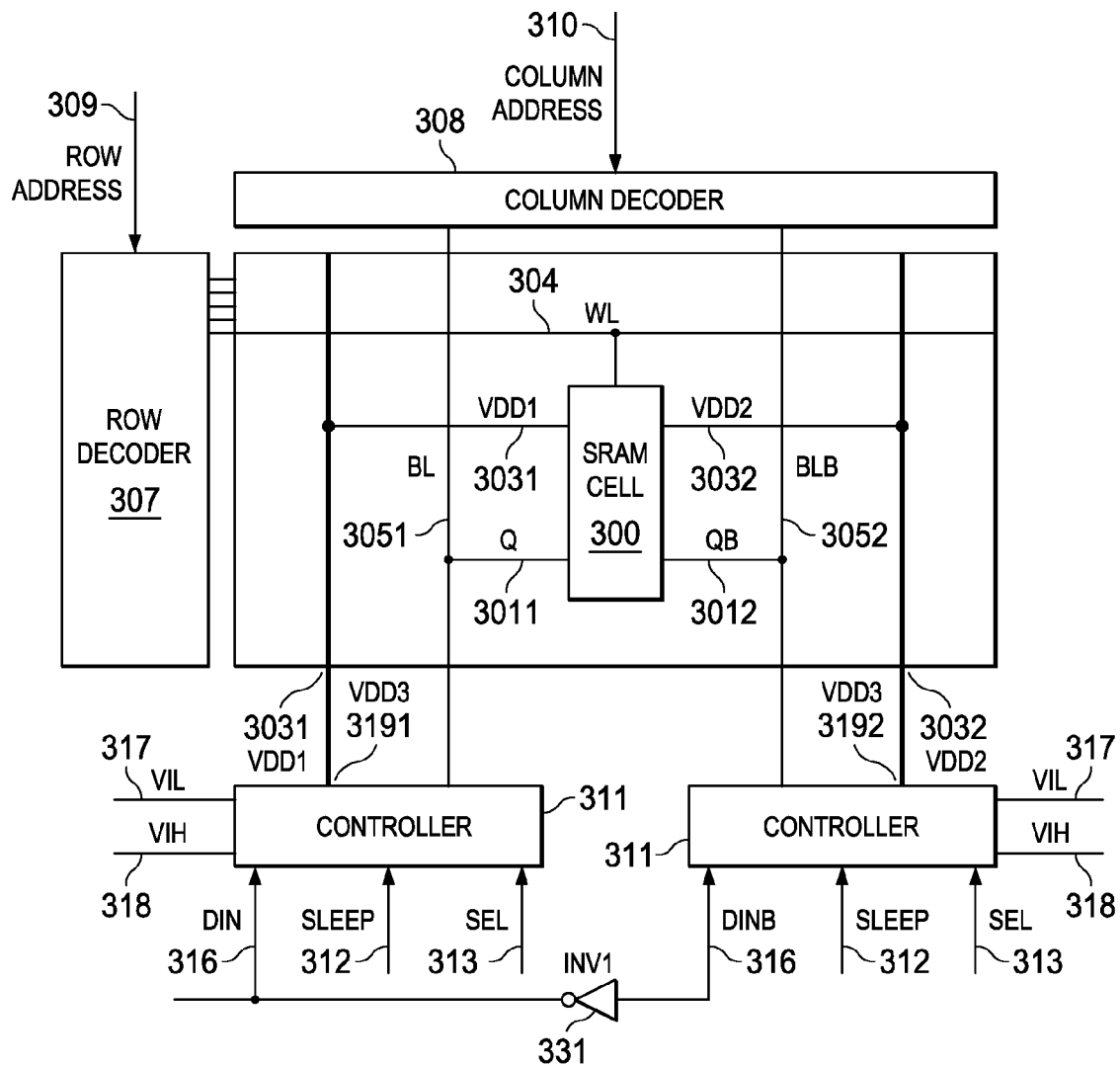
FIG. 11(A) is a schematic view of illustrative embodiment of an SRAM memory system wherein a memory cell is connected to two different input voltages CVDD1 and CVDD2, while the input voltages CVDD1 and CVDD2 are controlled by two different controllers with input data Din and its complement as a control signal respectively, together with its operation shown in Table FIG. 11(B).

An illustrative embodiment of an SRAM system comprising of a plurality of SRAM cells 300 and a plurality of control circuits 311 is shown in FIG. 11(A). A first controller 311 has inputs 317 VIL, 318 VIH, 316 DIN, 312 Sleep, and 313 sel, which would function as previously shown in FIG. 9(A). A second controller 311 has inputs 317 VIL, 318 VIH, 312 Sleep, and 313 sel. The second controller 311 has a data input signal 316 DINB, which is a complement of the data input signal 316 DIN for the first controller. Both controllers function as shown in FIG. 9(D).

An SRAM cell 300 is connected to a first bit line 3051BL and a second bit line 3052 BLB, which are controlled by a column decoder 308. The 304 word line connected to the SRAM cell is used to select the word, based on signals produced by the row decoder 307. The SRAM cell 300 has a first stored value signal 3011Q and a second stored value signal 3012 QB, as previously shown in FIG. 3. The first input voltage signal 3031Vdd1 is connected to an output voltage signal 3191 Vdd3 produced by the first controller 311. The second input voltage signal 3032Vdd2 is connected to an output voltage signal 3192 Vdd3 produced by the second controller 311.

When the sleep signal 312 Sleep signal is High, which means the SRAM memory cell 300 is in Sleep mode, both the output 3191 Vdd3 and 3192 Vdd3 produced by the two controllers have the same value as the first input voltage signal VIL. Therefore both 3031 Vdd1 and 3032 Vdd2 have the same value as 317 VIL, as shown in FIG. 11(B).

When the 312 Sleep signal is low and the 313 sel signal is low which represents the SRAM memory cell is in Read mode, the output voltage signal 3191 Vdd3 and 3192 Vdd3 have an equal value to the second input voltage signal 318 VIH. Therefore both 3031 Vdd1 and 3032 Vdd2 have the same value as 318 VIH, as shown in FIG. 11(B).

When the 312 Sleep signal is low and the 313 sel signal is high which represents an SRAM memory cell is in Write mode, if the data input signal 316 DIN is LOW, the first output voltage signal 3191 Vdd3 has an equal value to the first input voltage signal 318 VIH. On the other hand, the second controller has the control as 316 DINB which is the complement of 316 DIN, therefore 316 DINB to the second controller would be of High, and it leads to the output voltage 3192 Vdd3 to be of 317 VIL. Therefore 3031 Vdd1 has the value as 318 VIH and 3032 Vdd2 has the value as 317 VIL, as shown in FIG. 11(B).

Finally, when the 312 Sleep signal is low, the 313 sel signal is high which represents an SRAM memory cell is in Write mode, if the data input signal 316 DIN is HIGH, the output voltage signal 3191 Vdd3 has a value equal to the first input voltage signal 317 VIL, while the output voltage signal 3192 Vdd3 has the value 318 VIH, as shown in FIG. 11(B).

An SRAM cell 300 in the SRAM system shown in FIG. 11(A) can be implemented using various storage units and access units assembled according to the structure shown in FIG. 3. For illustrative purpose, the storage unit 302 of the SRAM cell 300 may be implemented using an embodiment shown in FIG. 4(A) or using another embodiment shown in FIG. 4(B) independent of the choices of how other parts are implemented. Similarly, the first access unit 3061 or the second access unit 3062 may be implemented using an embodiment shown in FIG. 5(A) or using another embodiment shown in FIG. 5(C) independent of the choices of how other parts are implemented. It is further possible that different SRAM cells comprise components that may be implemented by different structures shown in FIGS. 3-9, or their variations.

For similar reasons, the control unit 311 in the SRAM system shown in FIG. 11(A) can be implemented using various control structures shown in FIGS. 9(A)-9(C) and FIG. 10. Those of skill in the art will readily recognize that there are many other variations to form the controller unit 311 according to the principles shown in FIG. 3, which can be implemented in FIG. 11(A).

An illustrative method of operating an SRAM cell comprises: receiving by a storage unit a first input voltage signal and a second input voltage signal with a different value from the first input voltage signal; maintaining by the storage unit a first stored value signal and a second stored value signal, wherein when the first stored value signal is of value 0, the second stored value signal has a value equal to the second input voltage signal, and when the second stored value signal is of value 0 the first stored value signal has a value equal to the first input voltage signal; selectively reading the first stored value signal to a first bit line signal through a first access unit connected to the first stored value signal of the storage unit and controlled by a word line signal, or writing a value of the first bit line signal to the first stored value signal through the first access unit; selectively reading the second stored value signal to a second bit line signal through a second access unit connected to the second stored value signal of the storage unit and controlled by the word line signal, or writing a value of the second bit line signal to the second stored value signal through the second access unit.

A method of generating an output voltage comprises: generating a first voltage control output signal by a first voltage access control unit, wherein the first voltage access control unit is connected to a sleep signal, a selection signal, and a data input signal, and controlling a first voltage access unit with a first input voltage signal as an input; generating a second voltage control output signal by a second voltage access control unit, wherein the second voltage access control unit is controlled by a sleep signal, a selection signal, and a data input signal, and controlling a second voltage access unit with a second input voltage signal as an input; generating an output voltage signal connected to the first voltage access unit and the second voltage access unit wherein the output voltage signal has a value equal to the first input voltage signal when either the sleep signal is High or when the sleep signal is low, the selection signal is high, and the data input signal is High; and wherein the output voltage signal has a value equal to the second input voltage signal when either the sleep signal is low and the selection signal is low or when the sleep signal is low, the selection signal is high, and the data input signal is low.

The SRAM cells and the control circuits can be disposed in currently available technology such as in a semiconductor device or on a printed circuit board. They can be disposed in future available technology as well.

Although the present embodiments and their advantages have been described in detail, it should be understood that various changes, substitutions and alterations can be made herein without departing from the spirit and scope of the disclosure as defined by the appended claims. For example, many of the features and functions discussed above can be implemented in software, hardware, or firmware, or a combination thereof. As another example, it will be readily understood by those skilled in the art that may be varied while remaining within the scope of the present disclosure.

For instance, in some embodiments, the present disclosure provides for a A Static Random Access Memory (SRAM) cell comprising: a storage unit comprising a cross-coupled inverter and having a first input coupled to a first level voltage node, a second input coupled to a second level voltage node, wherein the second level is different from the first level, a first output node, and a second output node, wherein the storage unit is configured to maintain the first out node at a voltage corresponding to the first level when the second output node is at a logical 0 level, and further configured to maintain the second output node at a voltage corresponding to the second level when the first output node is at a logical 0 level; a first access unit having a first input coupled to the first output node of the storage unit, a second input coupled to a word line, and an output coupled to a bit line, the first access unit configured to couple a voltage on the first output node of the storage unit to the bit line in response to a signal on the word line; and a second access unit having a first input coupled to the second output node of the storage unit, a second input coupled to the word line, and an output coupled to a bit bar line, the first access unit configured to couple a voltage on the second output node of the storage unit to the bit bar line in response to the signal on the word line.

In some embodiments, the cross-coupled converter comprises: a first inverter comprising a first PMOS transistor series connected to a first NMOS transistor; a second inverter comprising a second PMOS transistor series connected to a second NMOS transistor; wherein an output of the first inverter is coupled to an input of the second inverter and to the first output node of the storage unit, and an output of the second inverter is coupled to an input of the first inverter and to the second output node of the storage unit.

In some embodiments, the cross-coupled converter comprises: a first resistor series coupled with an NMOS transistor at a first common node; and a second resistor series coupled with a second NMOS transistor at a second common node; wherein the first common node is coupled to a gate of the second NMOS transistor and to the second output node of the storage unit, and the second common node is coupled to a gate of the first NMOS transistor and to the first output node of the storage unit. In some embodiments, the second level voltage is about eighty percent of the first level voltage.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

Advantageous feature of the present disclosures include, but are not limited to, the following:

A Static Random Access Memory (SRAM) cell comprising:

a storage unit configured to receive a first input voltage signal and a second input voltage signal with a different value from the first input voltage signal, and to maintain a first stored value signal and a second stored value signal, wherein when the first stored value signal is of value 0, the second stored value signal has a value equal to the second input voltage signal, and when the second stored value signal is of value 0 the first stored value signal has a value equal to the first input voltage signal;

a first access unit connected to the first stored value signal of the storage unit and controlled by a word line signal, configured to read the first stored value signal to a first bit line signal or to write the value of the first bit line signal to the first stored value signal; and a second access unit connected to the second stored value signal of the storage unit and controlled by the word line signal, configured to read the second stored value signal to a second bit line signal or to write the value of the second bit line signal to the second stored value signal.

The SRAM cell of claim 1, wherein the storage unit comprises:

a first P-transistor, wherein the first input voltage signal is connected to a first terminal of the first P-transistor;

a second P-transistor, wherein the second input voltage signal is connected to a first terminal of the second P-transistor, a second terminal of the second P-transistor being connected to a gate of the first P-transistor, a second terminal of the first P-transistor being connected to a gate of the second P-transistor;

a first N-transistor, wherein a first terminal of the first N-transistor is connected to the second terminal of the first P-transistor, a gate of the first N-transistor is connected to the gate of the first P-transistor, and a second terminal of the first N-transistor is connected to a ground signal;

a second N-transistor, wherein a first terminal of the second N-transistor is connected to the second terminal of the second P-transistor, a gate of the second N-transistor is connected to the gate of the second P-transistor, and a second terminal of the second N-transistor is connected to the ground signal;

the first stored value signal being connected to the gate of the second P-transistor; and the second stored value signal being connected to the gate of the first P-transistor.

The SRAM cell of claim 1, wherein the storage unit comprises:

a first resistor, wherein the first input voltage signal is connected to a first terminal of the first resistor;

a second resistor, wherein the second input voltage signal is connected to a first terminal of the second resistor;

a first N-transistor, wherein a first terminal of the first N-transistor is connected to a second terminal of the first resistor, a gate of the first N-transistor is connected to a second terminal of the second resistor, and a second terminal of the first N-transistor is connected to a ground signal;

a second N-transistor, wherein a first terminal of the second N-transistor is connected to a second terminal of the second resistor, a gate of the second N-transistor is connected to a second terminal of the first resistor, and a second terminal of the second N-transistor is connected to the ground signal;

the first stored value signal being connected to the second terminal of the first resistor; and the second stored value signal being connected to the second terminal of the second resistor.

The SRAM cell of claim 1, wherein the first access unit comprises:

a first N-transistor, wherein the word line signal is connected to a gate of the first N-transistor, the first stored value signal is connected to a first terminal of the first N-transistor, and the first bit line signal is connected to a second terminal of the first N-transistor.

The SRAM cell of claim 1, wherein the first access unit further comprising:

a first N-transistor, wherein the word line signal is connected to a gate of the first N-transistor, the first stored value signal is connected to a first terminal of the first N-transistor, and the first bit line signal is connected to a second terminal of the first N-transistor; and a second N-transistor, wherein the word line signal is connected to a gate of the second N-transistor, the first stored value signal is connected to a first terminal of the second N-transistor, and the first bit line signal is connected to a second terminal of the second N-transistor.

The SRAM cell of claim 1, wherein:
the first input voltage signal has a value equal to 80% of the value of the second input voltage signal.

The SRAM cell of claim 1, wherein:
the storage unit further comprises:
a first P-transistor, wherein the first input voltage signal is connected to a first terminal of the first P-transistor;
a second P-transistor, wherein the second input voltage signal is connected to a first terminal of the second P-transistor, a second terminal of the second P-transistor is connected to a gate of the first P-transistor, a second terminal of the first P-transistor is connected to a gate of the second P-transistor;
a first N-transistor, wherein a first terminal of the first N-transistor is connected to the second terminal of the first P-transistor, a gate of the first N-transistor is connected to the gate of the first P-transistor, and a second terminal of the first N-transistor is connected to a ground signal;
a second N-transistor, wherein a first terminal of the second N-transistor connected to the second terminal of the second P-transistor, a gate of the second N-transistor connected to the gate of the second P-transistor, and a second terminal of the second N-transistor connected to the ground signal;
the first stored value signal being connected to the gate of the second P-transistor;
the second stored value signal being connected to the gate of the first P-transistor;
and the access unit further comprises:
a third N-transistor, wherein the word line signal is connected to a gate of the third N-transistor, the first stored value signal is connected to a first terminal of the third N-transistor, and the first bit line signal is connected to a second terminal of the third N-transistor.

The SRAM cell of claim 1, wherein:
the storage unit further comprises:
a first P-transistor, wherein the first input voltage signal is connected to a first terminal of the first P-transistor;
a second P-transistor, wherein the second input voltage signal is connected to a first terminal of the second P-transistor, a second terminal of the second P-transistor is connected to a gate of the first P-transistor, and a second terminal of the first P-transistor is connected to a gate of the second P-transistor;
a first N-transistor, wherein a first terminal of the first N-transistor is connected to the second terminal of the first P-transistor, a gate of the first N-transistor is connected to the gate of the first P-transistor, and a second terminal of the first N-transistor is connected to a ground signal;
a second N-transistor, wherein a first terminal of the second N-transistor is connected to the second terminal of the second P-transistor, a gate of the second N-transistor is connected to the gate of the second P-transistor, and a second terminal of the second N-transistor is connected to the ground signal; and
the first stored value signal being connected to the gate of the second P-transistor;
the second stored value signal being connected to the gate of the first P-transistor;
and the access unit further comprises:
a third N-transistor, wherein the word line signal is connected to a gate of the third N-transistor, the first stored value signal is connected to a first terminal of the third N-transistor, and the first bit line signal is connected to a second terminal of the third N-transistor; and a fourth N-transistor, wherein the word line signal is connected to a gate of the fourth N-transistor, the first stored value signal is connected to a first terminal of the fourth N-transistor, and the first bit line signal is connected to a second terminal of the fourth N-transistor.

The SRAM cell of claim 1, wherein:
the storage unit further comprises:
a first resistor, wherein the first input voltage signal is connected to a first terminal of the first resistor;
a second resistor, wherein the second input voltage signal is connected to a first terminal of the second resistor;
a first N-transistor, wherein a first terminal of the first N-transistor is connected to a second terminal of the first resistor, a gate of the first N-transistor is connected to a second terminal of the second resistor, and a second terminal of the first N-transistor is connected to a ground signal;
a second N-transistor, wherein a first terminal of the second N-transistor is connected to a second terminal of the second resistor, a gate of the second N-transistor is connected to a second terminal of the first resistor, and a second terminal of the second N-transistor is connected to the ground signal;
the first stored value signal being connected to the second terminal of the first resistor; and
the second stored value signal being connected to the second terminal of the second resistor; and
the access unit further comprises:
a third N-transistor, wherein the word line signal is connected to a gate of the third N-transistor, the first stored value signal is connected to a first terminal of the third N-transistor, and the first bit line signal is connected to a second terminal of the third N-transistor.

A method of operating an SRAM cell comprising:
receiving a first input voltage signal and a second input voltage signal with a different value from the first input voltage signal;
maintaining a first stored value signal and a second stored value signal, wherein when the first stored value signal is of value 0, the second stored value signal has a value equal to the second input voltage signal, and when the second stored value signal is of value 0 the first stored value signal has a value equal to the first input voltage signal;
selectively reading the first stored value signal to a first bit line signal, or writing a value of the first bit line signal to the first stored value signal;
selectively reading the second stored value signal to a second bit line signal, or writing a value of the second bit line signal to the second stored value signal.

The method of claim 10 wherein maintaining a first stored value signal and a second stored value signal comprises storing the first stored value signal at an output of a first inverter of a cross-coupled inverter and storing the second stored value signal at an output of a second inverter of a cross-coupled inverter.

A circuit, comprising:
a first input voltage signal connected to a first voltage access unit;
a second input voltage signal connected to a second voltage access unit;
a first voltage access control unit, wherein the first voltage access control unit is connected to a sleep signal, a selection signal, and a data input signal, and produces a first voltage control output signal to the first voltage access unit;
a second voltage access control unit, wherein the second voltage access control unit is controlled by the sleep signal, the selection signal, and the data input signal, and produces a second voltage control output signal to the second voltage access unit; and an output voltage signal connected to the first voltage access unit and the second voltage access unit wherein the output voltage signal has a value equal to the first input voltage signal when either the sleep signal is High or when the sleep signal is low, the selection signal is high, and the data input signal is High; and wherein the output voltage signal has a value equal to the second input voltage signal when either the sleep signal is low and the selection signal is low or when the sleep signal is low, the selection signal is high, and the data input signal is low.

The circuit of claim 10, wherein the second voltage control output is a complement of the first voltage control output signal and wherein the second voltage access control unit comprises an inverter.

A method of operating an SRAM cell comprising:

receiving a first input voltage signal and a second input voltage signal with a different value from the first input voltage signal;

maintaining a first stored value signal and a second stored value signal, wherein when the first stored value signal is of value 0, the second stored value signal has a value equal to the second input voltage signal, and when the second stored value signal is of value 0 the first stored value signal has a value equal to the first input voltage signal;

selectively reading the first stored value signal to a first bit line signal, or writing a value of the first bit line signal to the first stored value signal; and selectively reading the second stored value signal to a second bit line signal, or writing a value of the second bit line signal to the second stored value signal.

The circuit of claim 10, wherein the first access unit comprises:

a first P-transistor, wherein the first input voltage signal is connected to a first terminal of the P-transistor, the first control output is connected to a gate of the first P-transistor, and the output voltage signal is connected to a second terminal of the P-transistor.

The circuit of claim 10, wherein the first voltage access control unit comprises:

a first P-transistor, wherein a voltage signal is connected to a first terminal of the first P-transistor, the sleep signal is connected to a gate of the first P-transistor, and a second terminal of the first P-transistor is connected to a power supply of a first NAND gate;

a first N-transistor, wherein the sleep signal is connected to a gate of the first N-transistor, a ground signal is connected to a first terminal of the first N-transistor, and the control output is connected to a second terminal of the first N-transistor; and a first NAND gate, wherein the selection signal and the data input signal are connected to a first input and a second input of the NAND gate respectively, and the voltage control output signal is connected to a first output of the NAND gate.

A method of generating an output voltage signal comprising:

receiving a first input voltage signal and a second input voltage signal with a different value from the first input voltage signal;

receiving a sleep signal, a selection signal, and a data input signal;

generating a first voltage control output signal based on the sleep signal, the selection signal, and the data input signal;

generating a second voltage control output signal based on the sleep signal, the selection signal, and the data input signal; and generating an output voltage signal, wherein the output voltage signal has a value equal to the first input voltage signal when either the sleep signal is High or when the sleep signal is low, the selection signal is high, and the data input signal is High; and wherein the output voltage signal has a value equal to the second input voltage signal when either the sleep signal is low and the selection signal is low or when the sleep signal is low, the selection signal is high, and the data input signal is low.

What is claimed is:

1. A Static Random Access Memory(SRAM) cell comprising:
    a storage unit configured to receive a first input voltage signal and a second input voltage signal with a different value from the first input voltage signal, and to maintain a first stored value signal and a second stored value signal, wherein when the first stored value signal is of value 0, the second stored value signal has a value equal to the second input voltage signal, and when the second stored value signal is of value 0 the first stored value signal has a value equal to the first input voltage signal;
    a first access unit connected to the first stored value signal of the storage unit and controlled by a word line signal, configured to read the first stored value signal to a first bit line signal or to write the value of the first bit line signal to the first stored value signal; and
    a second access unit connected to the second stored value signal of the storage unit and controlled by the word line signal, configured to read the second stored value signal to a second bit line signal or to write the value of the second bit line signal to the second stored value signal.

2. The SRAM cell of claim 1, wherein the storage unit comprises:
    a first P-transistor, wherein the first input voltage signal is connected to a first terminal of the first P-transistor;
    a second P-transistor, wherein the second input voltage signal is connected to a first terminal of the second P-transistor, a second terminal of the second P-transistor being connected to a gate of the first P-transistor, a second terminal of the first P-transistor being connected to a gate of the second P-transistor;
    a first N-transistor, wherein a first terminal of the first N-transistor is connected to the second terminal of the first P-transistor, a gate of the first N-transistor is connected to the gate of the first P-transistor, and a second terminal of the first N-transistor is connected to a ground signal;
    a second N-transistor, wherein a first terminal of the second N-transistor is connected to the second terminal of the second P-transistor, a gate of the second N-transistor is connected to the gate of the second P-transistor, and a second terminal of the second N-transistor is connected to the ground signal;
    the first stored value signal being connected to the gate of the second P-transistor; and
    the second stored value signal being connected to the gate of the first P-transistor.

3. The SRAM cell of claim 1, wherein the storage unit comprises:
    a first resistor, wherein the first input voltage signal is connected to a first terminal of the first resistor;
    a second resistor, wherein the second input voltage signal is connected to a first terminal of the second resistor;
    a first N-transistor, wherein a first terminal of the first N-transistor is connected to a second terminal of the first resistor, a gate of the first N-transistor is connected to a second terminal of the second resistor, and a second terminal of the first N-transistor is connected to a ground signal;

a second N-transistor, wherein a first terminal of the second N-transistor is connected to a second terminal of the second resistor, a gate of the second N-transistor is connected to a second terminal of the first resistor, and a second terminal of the second N-transistor is connected to a ground signal;

the first stored value signal being connected to the second terminal of the first resistor; and the second stored value signal being connected to the second terminal of the second resistor.

4. The SRAM cell of claim 1, wherein the first access unit comprises:

a first N-transistor, wherein the word line signal is connected to a gate of the first N-transistor, the first stored value signal is connected to a first terminal of the first N-transistor, and the first bit line signal is connected to a second terminal of the first N-transistor.

5. The SRAM cell of claim 1, wherein the first access unit further comprising:

a first N-transistor, wherein the word line signal is connected to a gate of the first N-transistor, the first stored value signal is connected to a first terminal of the first N-transistor, and the first bit line signal is connected to a second terminal of the first N-transistor; and a second N-transistor, wherein the word line signal is connected to a gate of the second N-transistor, the first stored value signal is connected to a first terminal of the second N-transistor, and the first bit line signal is connected to a second terminal of the second N-transistor.

6. The SRAM cell of claim 1, wherein:

the first input voltage signal has a value equal to 80% of the value of the second input voltage signal.

7. The SRAM cell of claim 1, wherein:

the storage unit further comprises:

a first P-transistor, wherein the first input voltage signal is connected to a first terminal of the first P-transistor;

a second P-transistor, wherein the second input voltage signal is connected to a first terminal of the second P-transistor, a second terminal of the second P-transistor is connected to a gate of the first P-transistor, a second terminal of the first P-transistor is connected to a gate of the second P-transistor;

a first N-transistor, wherein a first terminal of the first N-transistor is connected to the second terminal of the first P-transistor, a gate of the first N-transistor is connected to the gate of the first P-transistor, and a second terminal of the first N-transistor is connected to a ground signal;

a second N-transistor, wherein a first terminal of the second N-transistor connected to the second terminal of the second P-transistor, a gate of the second N-transistor connected to the gate of the second P-transistor, and a second terminal of the second N-transistor connected to a the ground signal;

the first stored value signal being connected to the gate of the second P-transistor;

the second stored value signal being connected to the gate of the first P-transistor;

and the access unit further comprises:

a third N-transistor, wherein the word line signal is connected to a gate of the third N-transistor, the first stored value signal is connected to a first terminal of the third N-transistor, and the first bit line signal is connected to a second terminal of the third N-transistor.

8. The SRAM cell of claim 1, wherein:

the storage unit further comprises:

a first P-transistor, wherein the first input voltage signal is connected to a first terminal of the first P-transistor;

a second P-transistor, wherein the second input voltage signal is connected to a first terminal of the second P-transistor, a second terminal of the second P-transistor is connected to a gate of the first P-transistor, and a second terminal of the first P-transistor is connected to a gate of the second P-transistor;

a first N-transistor, wherein a first terminal of the first N-transistor is connected to the second terminal of the first P-transistor, a gate of the first N-transistor is connected to the gate of the first P-transistor, and a second terminal of the first N-transistor is connected to a ground signal;

a second N-transistor, wherein a first terminal of the second N-transistor is connected to the second terminal of the second P-transistor, a gate of the second N-transistor is connected to the gate of the second P-transistor, and a second terminal of the second N-transistor is connected to a ground signal; and the first stored value signal being connected to the gate of the second P-transistor;

the second stored value signal being connected to the gate of the first P-transistor;

and the access unit further comprises:

a third N-transistor, wherein the word line signal is connected to a gate of the third N-transistor, the first stored value signal is connected to a first terminal of the third N-transistor, and the first bit line signal is connected to a second terminal of the third N-transistor; and a fourth N-transistor, wherein the word line signal is connected to a gate of the fourth N-transistor, the first stored value signal is connected to a first terminal of the fourth N-transistor, and the first bit line signal is connected to a second terminal of the fourth N-transistor.

9. The SRAM cell of claim 1, wherein:

the storage unit further comprises:

a first resistor, wherein the first input voltage signal is connected to a first terminal of the first resistor;

a second resistor, wherein the second input voltage signal is connected to a first terminal of the second resistor;

a first N-transistor, wherein a first terminal of the first N-transistor is connected to a second terminal of the first resistor, a gate of the first N-transistor is connected to a second terminal of the second resistor, and a second terminal of the first N-transistor is connected to a ground signal;

a second N-transistor, wherein a first terminal of the second N-transistor is connected to a second terminal of the second resistor, a gate of the second N-transistor is connected to a second terminal of the first resistor, and a second terminal of the second N-transistor is connected to the ground signal;

the first stored value signal being connected to the second terminal of the first resistor; and the second stored value signal being connected to the second terminal of the second resistor; and the access unit further comprises:

a third N-transistor, wherein the word line signal is connected to a gate of the third N-transistor, the first stored value signal is connected to a first terminal of the third N-transistor, and the first bit line signal is connected to a second terminal of the third N-transistor.

10. A method of operating an SRAM cell comprising:
receiving a first input voltage signal and a second input voltage signal with a different value from the first input voltage signal;
maintaining a first stored value signal and a second stored value signal, wherein when the first stored value signal is of value 0, the second stored value signal has a value equal to the second input voltage signal, and when the second stored value signal is of value 0 the first stored value signal has a value equal to the first input voltage signal;
selectively reading the first stored value signal to a first bit line signal, or writing a value of the first bit line signal to the first stored value signal; and
selectively reading the second stored value signal to a second bit line signal, or writing a value of the second bit line signal to the second stored value signal.

11. The method of claim 10 wherein maintaining a first stored value signal and a second stored value signal comprises storing the first stored value signal at an output of a first inverter of a cross-coupled inverter and storing the second stored value signal at an output of a second inverter of a cross-coupled inverter.

12. A circuit, comprising:
a first input voltage signal connected to a first voltage access unit;
a second input voltage signal connected to a second voltage access unit; a first voltage access control unit, wherein the first voltage access control unit is connected to a sleep signal, a selection signal, and a data input signal, and produces a first voltage control output signal to the first voltage access unit;
a second voltage access control unit, wherein the second voltage access control unit is controlled by the sleep signal, the selection signal, and the data input signal, and produces a second voltage control output signal to the second voltage access unit; and
an output voltage signal connected to the first voltage access unit and the second voltage access unit wherein the output voltage signal has a value equal to the first input voltage signal when either the sleep signal is High or when the sleep signal is low, the selection signal is high, and the data input signal is High; and wherein the output voltage signal has a value equal to the second input voltage signal when either the sleep signal is low and the selection signal is low or when the sleep signal is low, the selection signal is high, and the data input signal is low.

13. The circuit of claim 12, wherein the second voltage control output is a complement of the first voltage control output signal and wherein the second voltage access control unit comprises an inverter.

14. The circuit of claim 12, wherein the first access unit comprises:
a first P-transistor, wherein the first input voltage signal is connected to a first terminal of the P-transistor, the first control output is connected to a gate of the first P-transistor, and the output voltage signal is connected to a second terminal of the P-transistor.

15. The circuit of claim 12, wherein the first voltage access control unit comprises:
a first P-transistor, wherein a voltage signal is connected to a first terminal of the first P-transistor, the sleep signal is connected to a gate of the first P-transistor, and a second terminal of the first P-transistor is connected to a power supply of a first NAND gate;
a first N-transistor, wherein the sleep signal is connected to a gate of the first N-transistor, a ground signal is connected to a first terminal of the first N-transistor, and the control output is connected to a second terminal of the first N-transistor; and
a first NAND gate, wherein the selection signal and the data input signal are connected to a first input and a second input of the NAND gate respectively, and the voltage control output signal is connected to a first output of the NAND gate.

* * * * *